(12) United States Patent
Meng et al.

(10) Patent No.: US 11,289,323 B2
(45) Date of Patent: Mar. 29, 2022

(54) PROCESSING OF SEMICONDUCTORS USING VAPORIZED SOLVENTS

(71) Applicants: Mattson Technology, Inc., Fremont, CA (US); Beijing E-Town Semiconductor Technology, Co., LTD, Beijing (CN)

(72) Inventors: Shuang Meng, Milpitas, CA (US); Shawming Ma, Sunnyvale, CA (US); Michael X. Yang, Palo Alto, CA (US)

(73) Assignees: Beijing E-Town Semiconductor Co,, Ltd., Beijing (CN); Mattson Technology, Inc., Fremont, CA (US)

( * ) Notice: Subject to any disclaimer, the term of this patent is extended or adjusted under 35 U.S.C. 154(b) by 20 days.

(21) Appl. No.: 16/208,003

(22) Filed: Dec. 3, 2018

(65) Prior Publication Data

US 2019/0189479 A1 Jun. 20, 2019

Related U.S. Application Data

(60) Provisional application No. 62/599,105, filed on Dec. 15, 2017.

(51) Int. Cl.
*H01L 21/02* (2006.01)
*H01L 21/67* (2006.01)
*H01J 37/32* (2006.01)

(52) U.S. Cl.
CPC .. *H01L 21/02057* (2013.01); *H01J 37/32357* (2013.01); *H01J 37/32449* (2013.01); *H01L 21/67023* (2013.01); *H01L 21/67213* (2013.01)

(58) Field of Classification Search
None
See application file for complete search history.

(56) References Cited

U.S. PATENT DOCUMENTS

| | | | | |
|---|---|---|---|---|
| 4,983,548 A | * | 1/1991 | Uno | H01L 21/67396 438/800 |
| 6,207,583 B1 | * | 3/2001 | Dunne | H01L 21/02063 134/1.2 |
| 6,805,139 B1 | * | 10/2004 | Savas | G03F 7/427 134/1.1 |
| 2005/0091874 A1 | * | 5/2005 | Chen | H01L 21/02063 34/445 |
| 2006/0063388 A1 | * | 3/2006 | Yang | H01L 21/02071 438/745 |
| 2011/0289795 A1 | * | 12/2011 | Ishibashi | H01L 21/02054 34/467 |
| 2012/0227762 A1 | * | 9/2012 | Dussarrat | G03F 7/427 134/1.1 |
| 2015/0136171 A1 | | 5/2015 | Waldfried | |
| 2015/0357202 A1 | * | 12/2015 | Thedjoisworo | H01L 21/67069 438/725 |

* cited by examiner

*Primary Examiner* — Mikhail Kornakov
*Assistant Examiner* — Ryan L Coleman
(74) *Attorney, Agent, or Firm* — Dority and Manning, P.A.

(57) ABSTRACT

Processes and apparatuses for the treatment of semiconductor workpieces are provided. In some embodiments, a method can include placing the workpiece into a process chamber; vaporizing a solvent to create a vaporized solvent; introducing the vaporized solvent into the process chamber; and exposing the workpiece to the vaporized solvent.

8 Claims, 9 Drawing Sheets

PROCESSING OF SEMICONDUCTORS USING VAPORIZED SOLVENTS

PRIORITY CLAIM

The present application is based on and claims priority to U.S. Provisional Application No. 62/599,105, having a filing date of Dec. 15, 2017, which is incorporated by reference herein.

FIELD

The present disclosure relates generally to treatment of a workpiece using vaporized solvents.

BACKGROUND

Post-implantation photoresist removal and post-etch residue removal have been traditionally accomplished using an oxygen-containing plasma dry strip. However, the resultant silicon (Si) or silicon-germanium (SiGe) loss from the oxidizing chemistry can cause degradation of device performance, and the interaction of oxygen radicals with low-k films can cause low-k damage. Strip processes based on reducing chemistries (e.g. hydrogen and nitrogen) generally result in lower substrate loss. However, these types of processes do not completely resolve the material loss issue while also introducing additional problems. For example, hydrogen-based processes have low resist removal rates and hydrogen plasma can also cause device shifts due to vacancy formation deep inside the Si and SiGe substrates. Therefore, there is a need for new chemistries to be introduced into the dry strip process to meet increasing product performance requirements.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method can include placing the workpiece into a process chamber. The method can include vaporizing a solvent to create a vaporized solvent. The method can include introducing the vaporized solvent into the process chamber. The method can include exposing the workpiece to the vaporized solvent.

Other example aspects of the present disclosure are directed to systems, methods, and apparatuses for processing of workpieces.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
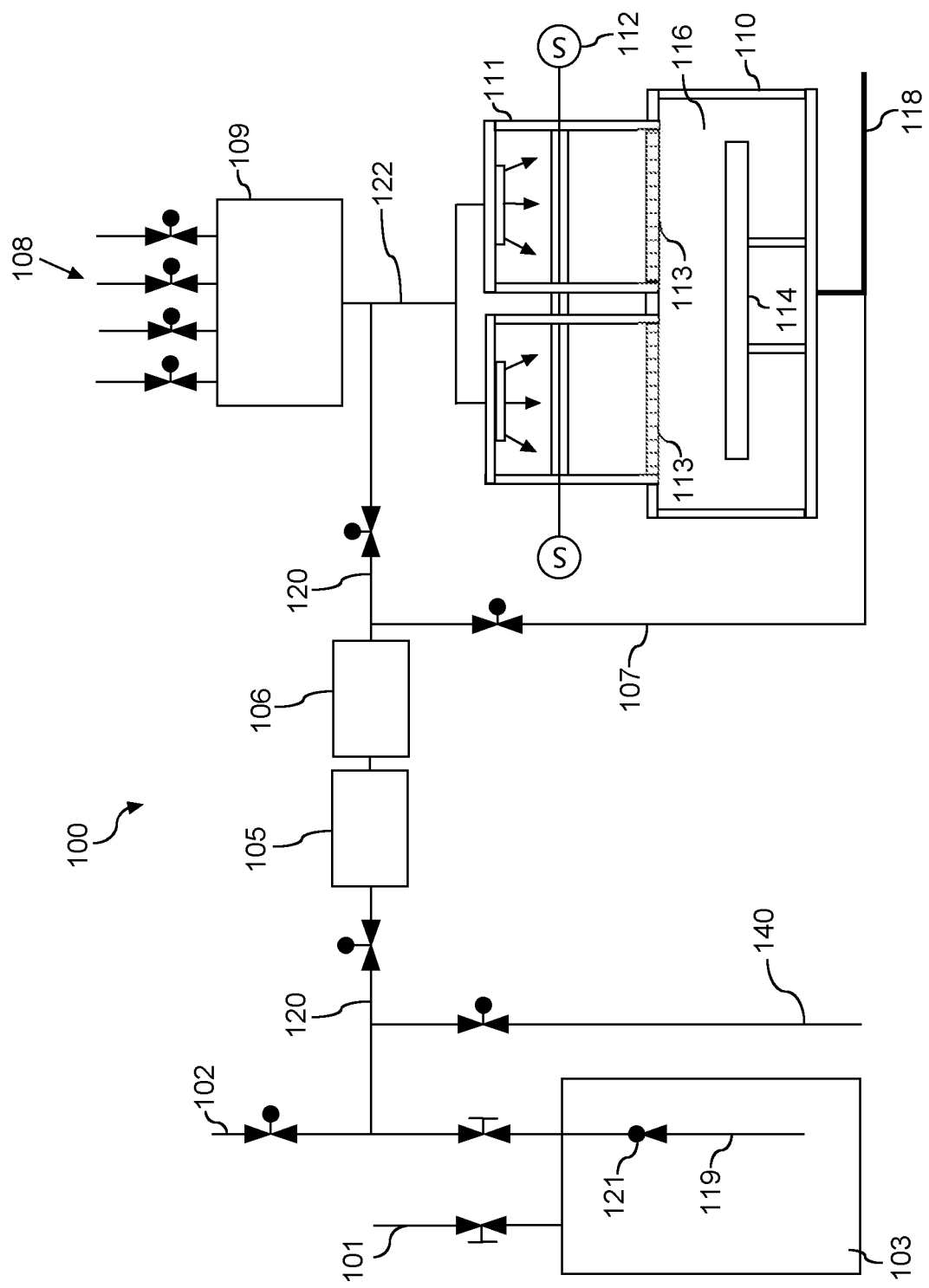
FIG. 1 depicts a semiconductor workpiece processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to semiconductor workpiece processing. More specifically, in some embodiments, example aspects of the present disclosure are directed toward workpiece surface cleaning, such as post-implantation photoresist and post-etch residue removal. The processes and apparatuses discussed herein can be used in both front-end-of-line and back-end-of-line applications. Embodiments can include a non-oxidizing dry-strip process that uses injecting of solvent chemicals into a process chamber to facilitate photoresist and post-etch residue removal. Embodiments can perform effective photoresist strip and residue removal with reduced surface damage and oxidation. The workpieces (e.g., Si and SiGe wafers) can be exposed to the chemical vapor of the solvent. The vaporized solvent can attack photoresist and post-etch residues on the workpiece surface. Furthermore, in some embodiments, a plasma can be generated and applied in combination with solvent vapor. The workpiece can then be exposed to radicals generated in the plasma which can assist in workpiece cleaning.

Example aspects of the present disclosure are discussed with reference to treating a semiconductor wafer workpiece for purposes of illustration and discussion. Those of ordinary skill in the art, using the disclosures provided herein, will understand that aspects of the present disclosure can be used in conjunction with the processing of other workpieces without deviating from the scope of the present disclosure. As used herein, the use of the term "about" in conjunction with a numerical value can refer to within 20% of the stated numerical value.

FIG. 1 depicts a semiconductor workpiece processing apparatus 100 according to example embodiments of the present disclosure. A solvent storage receptacle 103 containing a solvent is positioned upstream of the process chamber 110 and has a solvent feed gas line 101. The solvent storage receptacle 103 can be in the form of a liquid tank. The solvent feed gas line 101 can introduce a carrier gas to the solvent storage receptacle 103. The carrier gas can be inert (e.g., noble gas, nitrogen, etc.) or can otherwise be chemically active in the process.

The solvent feed gas line 101 can supply pressure to the solvent storage receptacle 103 to drive the solvent forward in the process through the solvent storage receptacle outlet line 119. Alternatively (or in conjunction), a solvent pump 121 can be provided on the solvent storage receptacle outlet line 119 to pull solvent from the solvent storage receptacle 103 and push the solvent through the solvent line 120 to the vaporizer 105. The solvent pump 121 (e.g., a positive displacement pump) can also serve to control the mass flow rate of solvent being sent to the vaporizer 105. A mass flow meter (MFM) 106 and/or a volumetric flow meter (not shown) can be provided on the solvent line 120. The mass flow meter 106 and/or volumetric flow meter can be located before or after the vaporizer 105 and can send information to a controller (not shown) to control the amount of solvent sent to the process chamber 110.

The controller can be any suitable control device for controlling operation of the system. For instance, the controller can include one or more processors and one or more memory devices. The one or more memory devices can store computer-readable instructions that when executed by the one or more processors cause the one or more processors to perform operations. The operations can include controlling flow of the solvent based on signals from the mass flow meter and/or volumetric flow meter. The vaporizer 105 can serve to vaporize liquid solvent coming from the solvent storage receptacle 103 and deliver the vaporized solvent downstream to the plasma chamber 111 and/or the process chamber 110 via the solvent line 120.

A purge gas line 102 can be connected to the solvent line 120 to, for example, purge out residue liquids in the solvent line 120 during system maintenance. A drain line 140 can be connected to the solvent line 120 for cleaning and maintenance of the processing apparatus 100. Furthermore, a bypass line 107 can be connected to the solvent line 120 such that the solvent bypasses the plasma chamber 111 and process chamber 110. The bypass line 107 can be particularly useful for obtaining the correct flow rate and composition in the solvent line 120 prior to administering the contents of the solvent line 120 to the plasma chamber 111 and the process chamber 110. The bypass line 107 can feed directly into the process chamber evacuation pump 118 where it can be discarded or recycled. The main function of the process chamber evacuation pump 118 is controlled removal of gasses (including solvent) from the process chamber 110. However, the process chamber evacuation pump 118 can also be used to clear the various gas lines of the processing apparatus 100.

The processing apparatus 100 can include various feed gas lines 108 and a gas box 109 where the gasses can be mixed and conditioned (e.g., with heating or cooling; i.e., the gas box can include heating and cooling elements, although not shown). The vaporized solvent (and optionally a carrier gas) can be delivered directly to the gas box 109 (as in FIG. 8) or can be delivered to the gas box outlet 122, where it can mix with other gasses coming from the gas box 109. As shown in FIG. 1, the vaporized solvent or a mixture of the vaporized solvent and other gases from the gas box 109 enters the process chamber 110 through a plasma chamber 111.

The plasma chamber 111 can include an RF plasma source 112. The RF plasma source 112 can be coupled to an inductive element to generate an inductively coupled plasma in the plasma chamber 111. A plasma can optionally be ignited in the plasma chamber 111 by turning on the RF plasma source 112. When the RF plasma source 112 is turned on, the vaporized solvent molecules can dissociate in the plasma and produce active species that assist in treating the surface of the workpiece 116 (e.g., a semiconductor wafer). The plasma chamber 111 can be separated from the process chamber 110 via a separation grid 113.

The resultant gas stream including the vaporized solvent and potentially other gasses exits the plasma chamber 111 and enters the process chamber 110. The process chamber 110 can include a seat or pedestal 114 for holding a workpiece 116. The process chamber 110 can also have multiple pedestals 114 for holding multiple workpieces 116, or a single pedestal 114 that can support multiple workpieces 116, as shown in FIG. 1. The gas stream exiting the plasma chamber 111 can pass through a separation grid 113 and enter the process chamber 110 where the workpiece 116 is placed. The separation grid 113 can serve to redistribute the gas flow evenly over the surface of the workpiece 116 and also filter out charged ions generated in the plasma. Therefore, the separation grid 113 can keep charged ions out of the process chamber 110 and allow neutral radicals generated in a plasma to pass through.

The workpiece 116 in the process chamber can then be exposed to a neutral radical stream that cleans the workpiece surface, attacks photoresist, and removes post-etch residues. Alternatively, the RF plasma source 112 can remain off. In this case, the workpiece(s) can be exposed to the vaporized solvent, or a mixture of the vaporized solvent and other gasses. The surface of the workpiece 116 can be cleaned via a chemical reaction that occurs between the vaporized solvent and the workpiece surface. That is, the vaporized solvent can react with photoresists and etch residues, or other films or substances on the surface of the workpiece 116.

Figure 2:
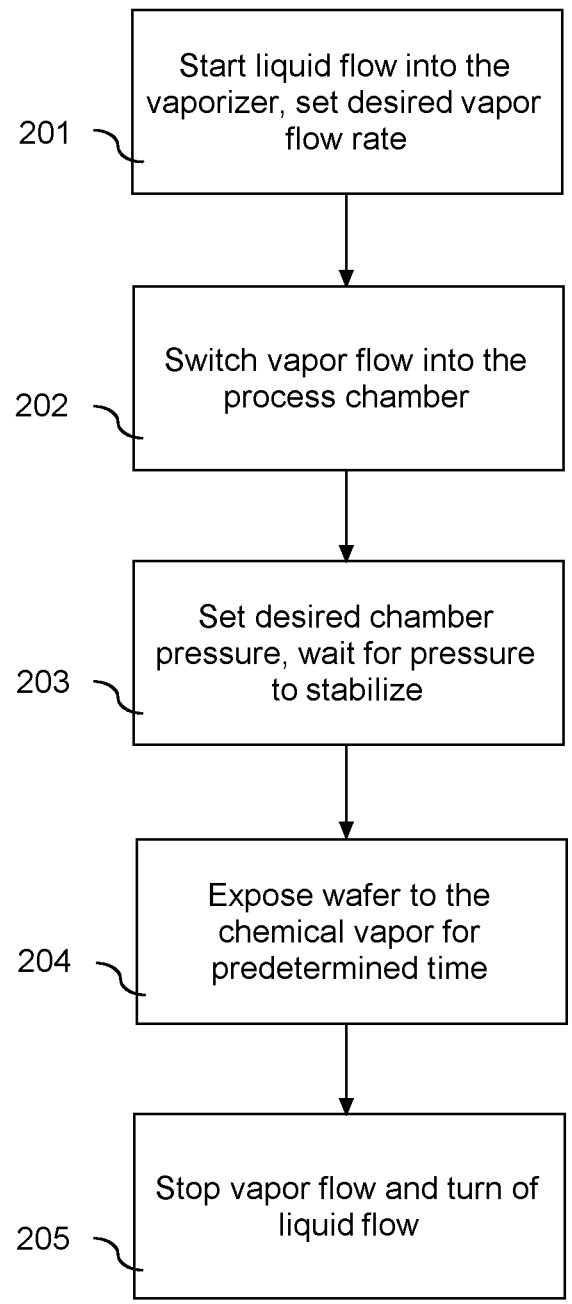
FIG. 2 depicts a flow diagram of a method according to example embodiments of the present disclosure.

FIG. 2 depicts a flow diagram of a method according to example embodiments of the present disclosure. The method will be described with reference to the apparatus embodiment of FIG. 1. FIG. 2 depicts steps performed in a particular order for purposes of illustration and discussion. Those of ordinary skill in the art, using the disclosures provided herein, will understand that various steps of any of the methods disclosed herein can be adapted, expanded, rearranged, omitted, performed simultaneously, and/or modified in various ways without deviating from the scope of the present disclosure.

The method begins with the initiation of liquid solvent flow to the vaporizer 105 and setting the desired flow rate (201). The desired flow rate can be achieved using the solvent pump 121, the mass or volumetric flow meter 106, and a controller. At this time, the vaporized solvent can be discharged to the bypass line 107. After the desired flow rate has been achieved, or the flow rate has reached the desired steady state conditions, the bypass line 107 can be closed and the solvent vapor flow can proceed to the process chamber (202). The solvent vapor (or a mixture of the vapor and other gasses) can continue filling the process chamber 110 until the pressure stabilizes at the desired chamber pressure (203). The desired pressure can be obtained using a pressure gauge in the process chamber or plasma chamber in combination with a pressure controller (not shown). The workpiece 116 (e.g. wafer) can then be exposed to the chemical vapor for a predetermined period of time (204). After the exposure of the workpiece to the solvent vapor is complete, solvent liquid flow to the vaporizer 105 can turned off and the solvent vapor flow to the process chamber 110 correspondingly stops (205). The residue chemicals and the remaining gasses in the process chamber 110 can then be evacuated by the process chamber evacuation pump 118.

Figure 3:
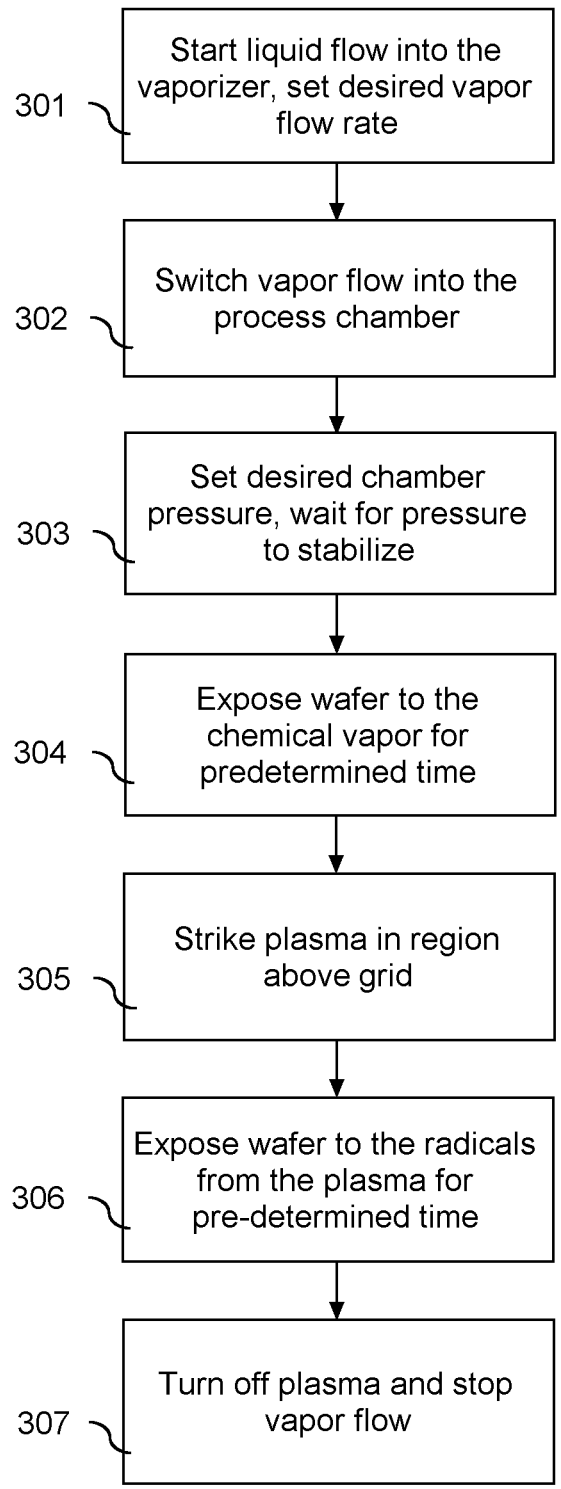
FIG. 3 depicts a flow diagram of a method according to example embodiments of the present disclosure.

FIG. 3 depicts a flow diagram of a method according to example embodiments of the present disclosure. The method will be described with reference to the apparatus embodiment of FIG. 1. FIG. 3 depicts steps performed in a particular order for purposes of illustration and discussion. Those of ordinary skill in the art, using the disclosures provided herein, will understand that various steps of any of the methods disclosed herein can be adapted, expanded, rearranged, omitted, performed simultaneously, and/or modified in various ways without deviating from the scope of the present disclosure.

The method begins with the initiation of liquid solvent flow to the vaporizer 105 and setting the desired flow rate (301). To initialize the system, the vaporized solvent can first be discharged to the bypass line 107. After the desired flow rate has been achieved, or the flow rate has reached the desired steady state, the bypass line 107 can be closed and the solvent vapor flow can proceed to the process chamber (302). The solvent vapor (or a mixture of the vapor and other gasses) can continue filling the process chamber 110 until the pressure stabilizes at the desired chamber pressure (303). The workpiece 116 (e.g. wafer) can then be exposed to the chemical vapor for a predetermined period of time (304). Next, the RF source 112 can be engaged to strike plasma in the plasma chamber 111, or the region above the separation grid 113 (305). The workpiece can then be exposed to the radicals created by the plasma for a predetermined amount of time (306). Alternatively, the RF source 112 can be engaged at an earlier time while the solvent is filling the plasma chamber 111 and the process chamber 110 (step not shown). This alternative process step can induce a greater number of solvent radicals in the process chamber 110. Finally, after the workpiece processing, the RF source 112 and solvent vapor flow can be stopped and the process chamber evacuated (307).

Figure 4:
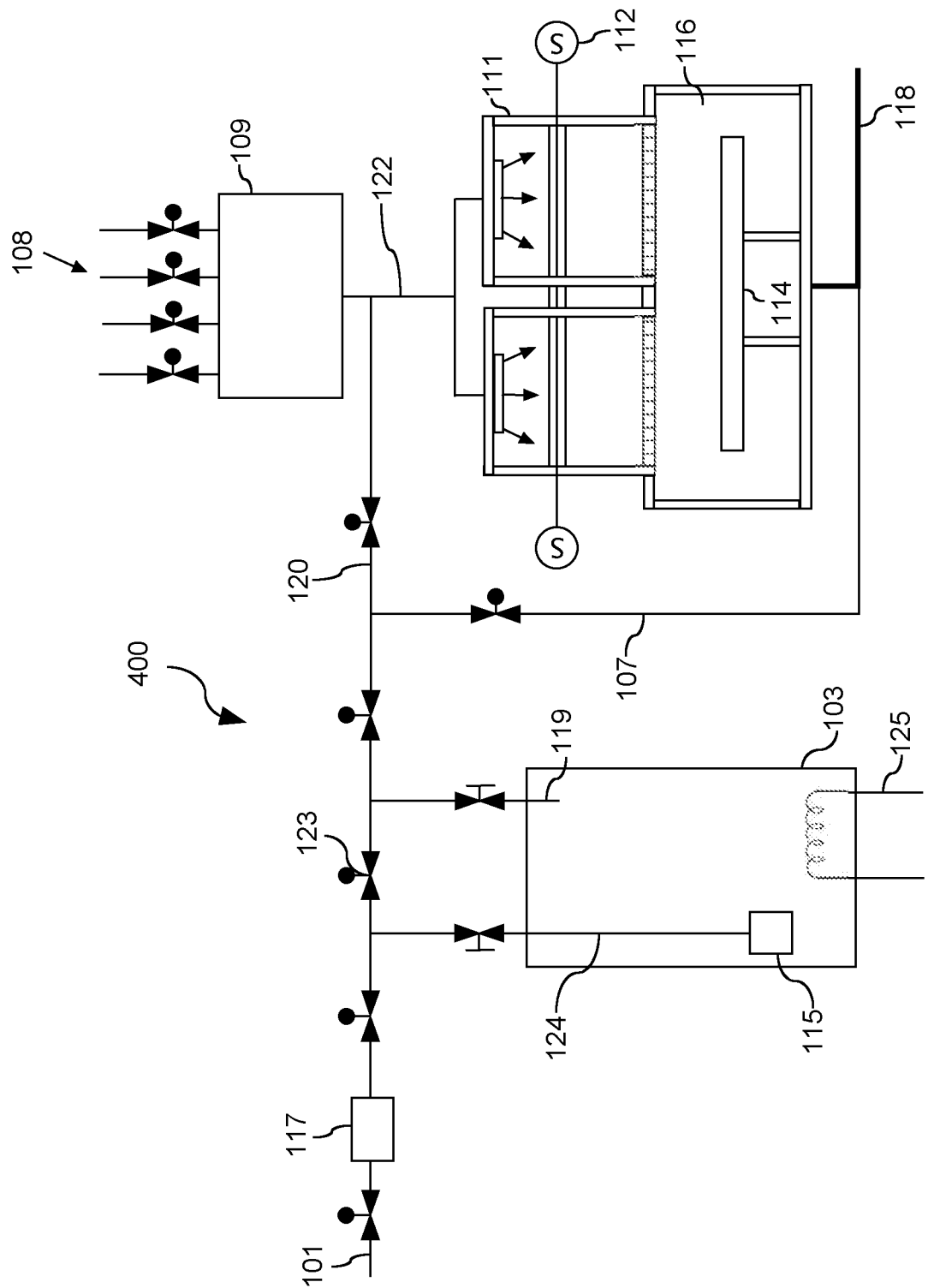
FIG. 4 depicts a semiconductor workpiece processing apparatus according to example embodiments of the present disclosure.

FIG. 4 illustrates a processing apparatus 400 according to example embodiments of the present disclosure. The solvent gas feed line 101 is shown carrying a feed gas through a mass flow controller 117 and to a solvent gas inlet line 124. The rate of feed gas delivered can be adjusted and maintained using the mass flow controller 117. A solvent storage receptacle bypass valve 123 can be included for bypassing feed gas around the solvent storage receptacle 103.

In the embodiment of FIG. 4, the solvent storage receptacle 103 is an ampoule that holds a metered quantity of liquid solvent. The solvent gas inlet line 124 can include a bubbler 115 that disperses the feed gas within the liquid solvent, effectively saturating the feed gas with solvent vapors. The solvent storage receptacle outlet line 119 can be above the liquid level inside the solvent storage receptacle 103 such that only solvent vapor (and potentially feed gas) can continue down the solvent line 120. The amount of solvent vapor that is fed into the solvent feed line 120 can also be controlled by adjusting the solvent vapor pressure using a solvent temperature control component 125. The solvent temperature control component 125 can be a coil that functions as a heating and cooling element, allowing for both raising and lowering the temperature of the solvent. Bidirectional solvent temperature control allows for precise control of the solvent vapor pressure, which is of primary importance in controlling the amount of solvent vapor being delivered downstream. Otherwise, the processing apparatus of FIG. 4 can operate in much the same manner, and assume alternative configurations, as the other processing apparatuses discussed herein.

Figure 5:
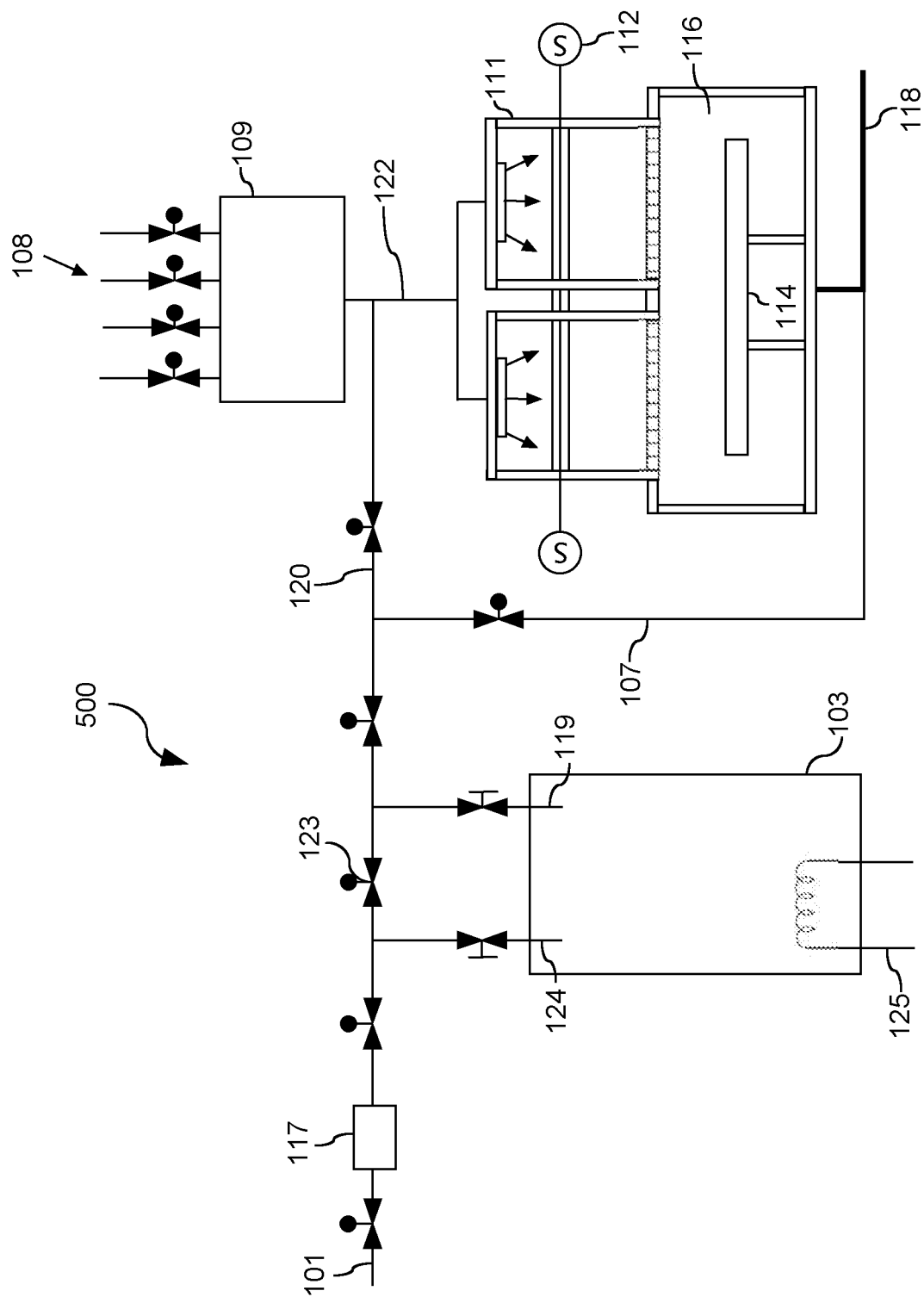
FIG. 5 depicts a semiconductor workpiece processing apparatus according to example embodiments of the present disclosure.

FIG. 5 illustrates an example processing apparatus 500 according to example embodiments the present disclosure. The processing apparatus 500 includes an ampoule (i.e., a solvent storage receptacle) 103 that contains a liquid solvent. The ampoule 103 maintains the liquid solvent at a preset temperature. The temperature can be maintained using a solvent temperature control component 125. The solvent temperature control component 125 can be in the form of a coil that conveys a fluid that heats or cools the liquid solvent. Instead of a coil, the solvent temperature control component 125 can be in the form of a shell or jacket that encompasses the solvent storage receptacle 103. The temperature control component can also include a temperature measurement device (e.g., a thermometer or thermocouple) in combination with a temperature controller. In the configuration of FIG. 5, the solvent storage receptacle outlet line 119 is above the solvent liquid level of the solvent ampoule 103. Therefore, the primary means of conveying vaporized solvent to the process chamber 110 is evaporation from the surface of the liquid solvent.

Figure 6:
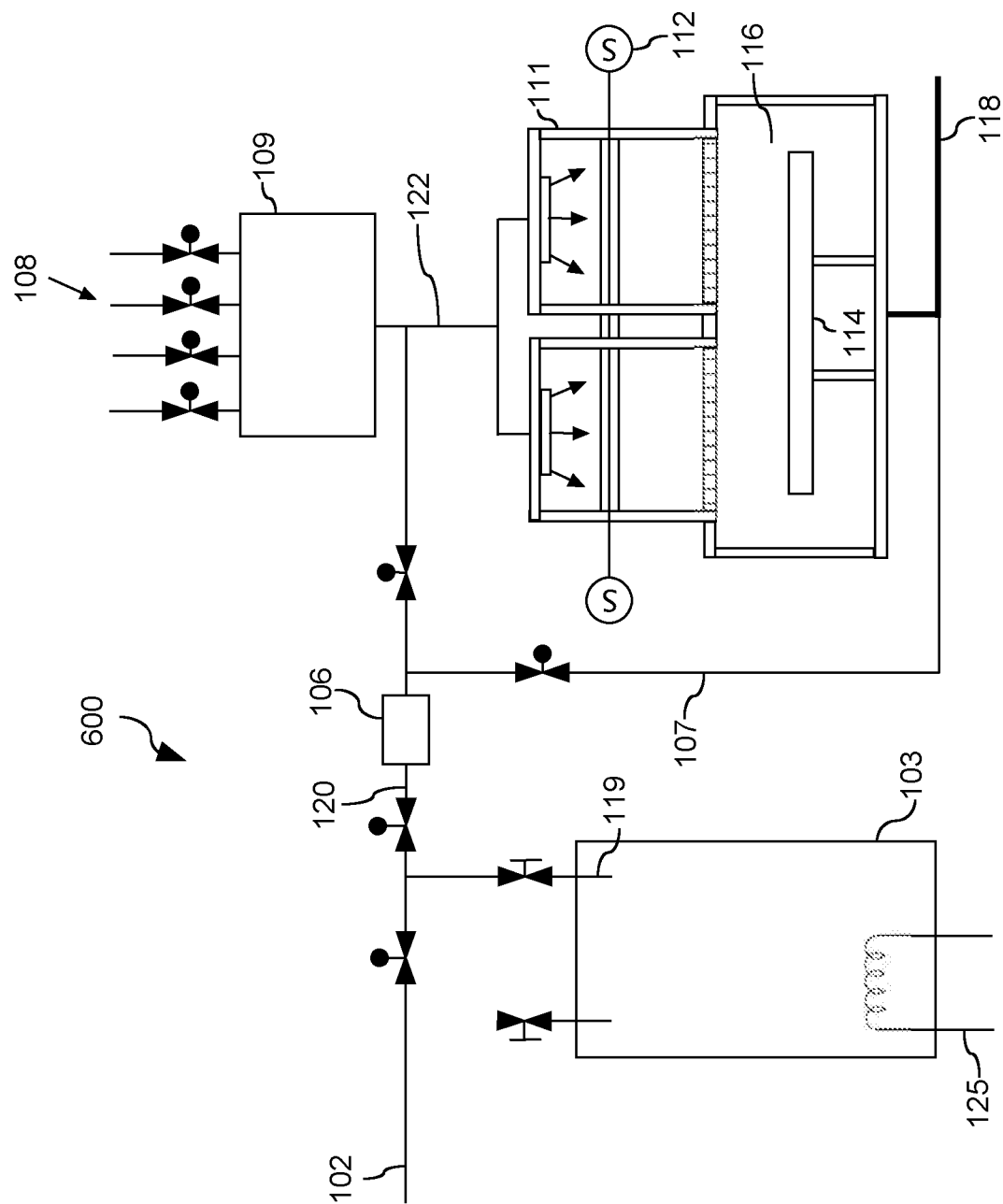
FIG. 6 depicts a semiconductor workpiece processing apparatus according to example embodiments of the present disclosure.

FIG. 6 illustrates an example processing apparatus 600 according to example embodiments of the present disclosure. The processing apparatus 600 does not have a feed gas line integrated within the solvent storage receptacle 103. The solvent storage receptacle can maintain the liquid solvent at a present temperature using a heating and cooling system 125. The temperature of the liquid solvent can then determine the pressure within the solvent storage receptacle 103, and the temperature can be raised if more solvent flow is desired. A mass or volumetric flow meter 106, a controller, and a control valve can be located on the solvent line 120 to control the solvent flow rate. The mass or volumetric flow meter 106 can therefore control the amount and rate of vaporized solvent going to the plasma chamber 111 and process chamber 120. The purge gas line 102 can be used to clean out the solvent line 120 and bypass line 107, for example, during system maintenance.

Figure 7:
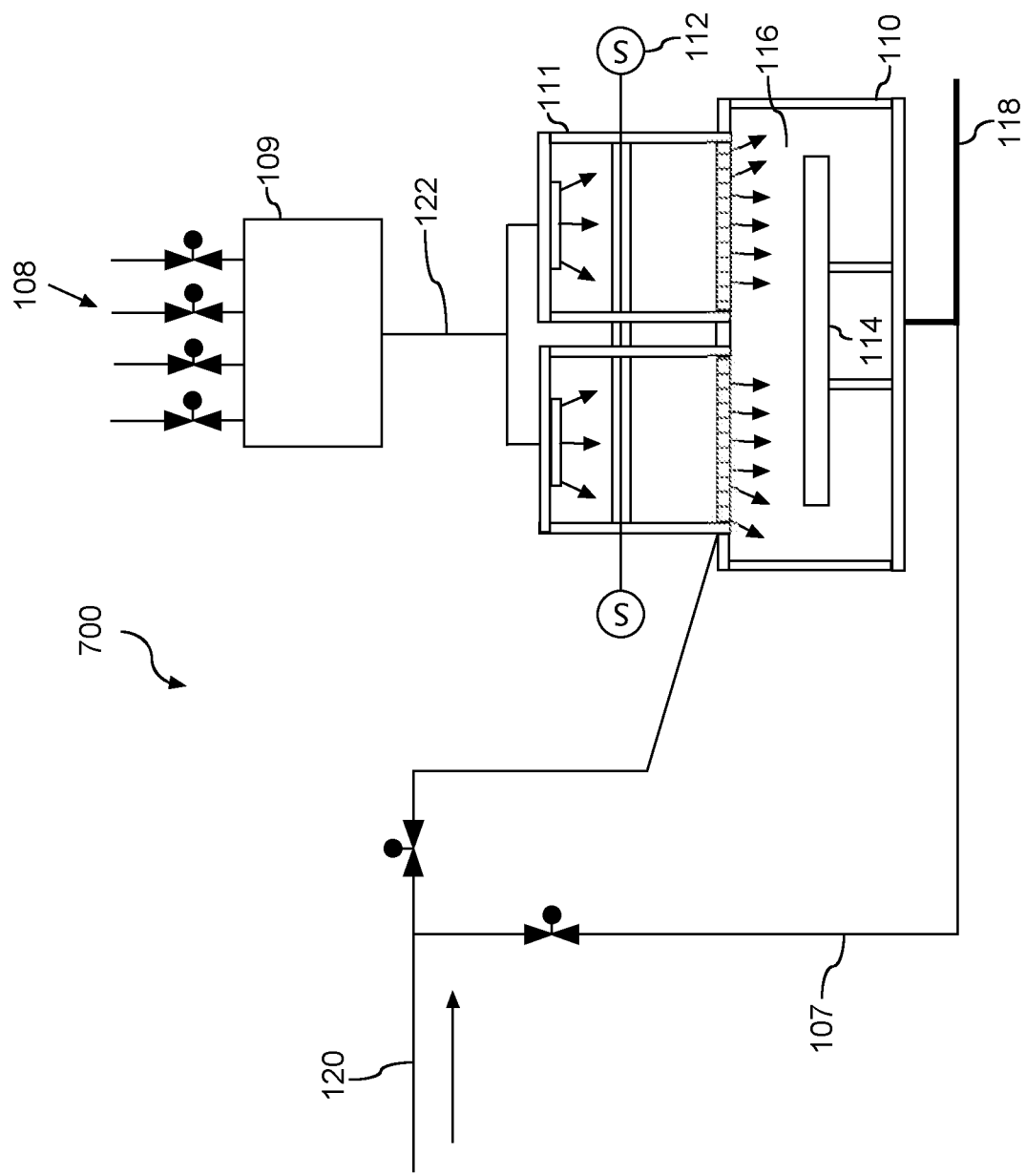
FIG. 7 depicts a semiconductor workpiece processing apparatus according to example embodiments of the present disclosure.

FIG. 7 illustrates an example processing apparatus 700 according to example embodiments the present disclosure. In the example of FIG. 7, the solvent line 120 discharges directly into the process chamber and bypasses the gas box 109, plasma chamber 111, RF source 112, and the separation grid 113.

Figure 8:
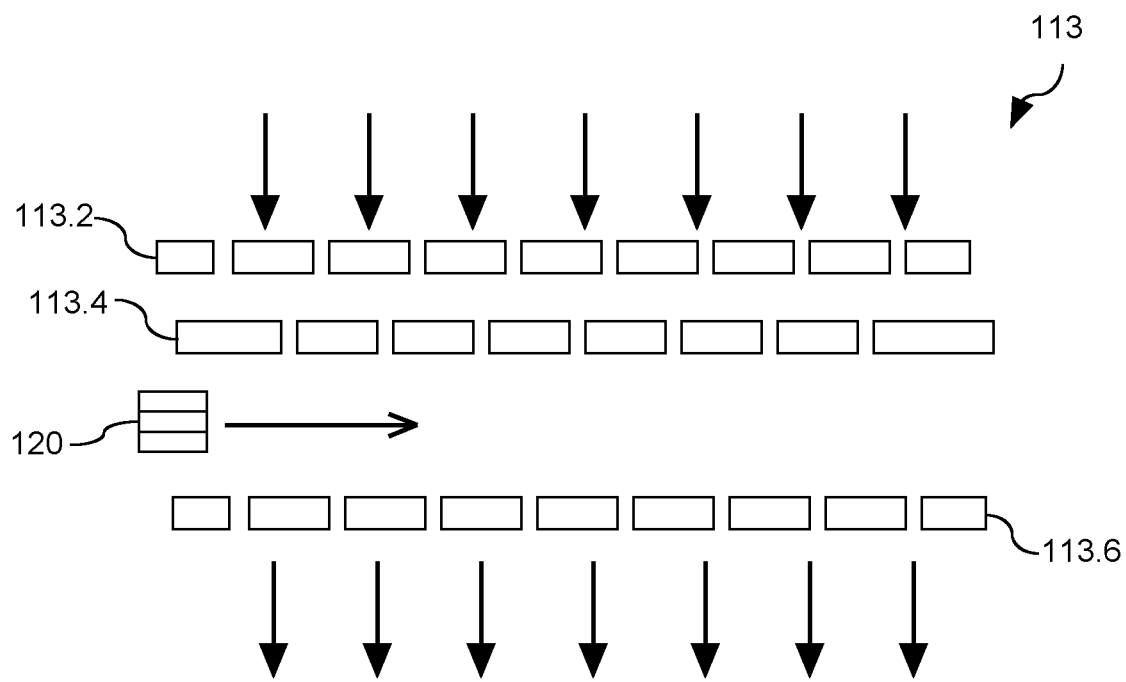
FIG. 8 depicts an example separation grid according to example embodiments of the present disclosure.

In some embodiments, the solvent line 120 can be configured to discharge into the process chamber via post-plasma injection in a multi-plate separation grid 113. For instance, FIG. 8 depicts a multi-plate separation grid 113 including a first grid plate 113.2 and a second grid plate 113.4 disposed in parallel relationship for UV/ion filtering.

The first grid plate 113.2 and a second grid plate 113.4 can be in parallel relationship with one another. The first grid plate 113.2 can have a first grid pattern having a plurality of holes. The second grid plate 113.4 can have a second grid pattern having a plurality of holes. The first grid pattern can be the same as or different from the second grid pattern. Charged particles (e.g., ions) can recombine on the walls in their path through the holes of each grid plate 113.2, 113.4 in the separation grid 113. Neutral species (e.g., radicals) can flow relatively freely through the holes in the first grid plate 113.2 and the second grid plate 113.4.

Subsequent to the second grid plate 113.2, the solvent line 120 can be configured to admit vaporized solvent into the particles flowing through the separation grid 113. The vaporized solvent and/or particles (e.g., neutral radicals) can pass through a third grid plate 113.6 into the process chamber 110. More or fewer grid plates can be used without deviating from the scope of the present disclosure. In addition, the solvent line 120 can be configured to admit vaporized solvent into the separation grid 113 at a location below the separation grid 113.

Figure 9:
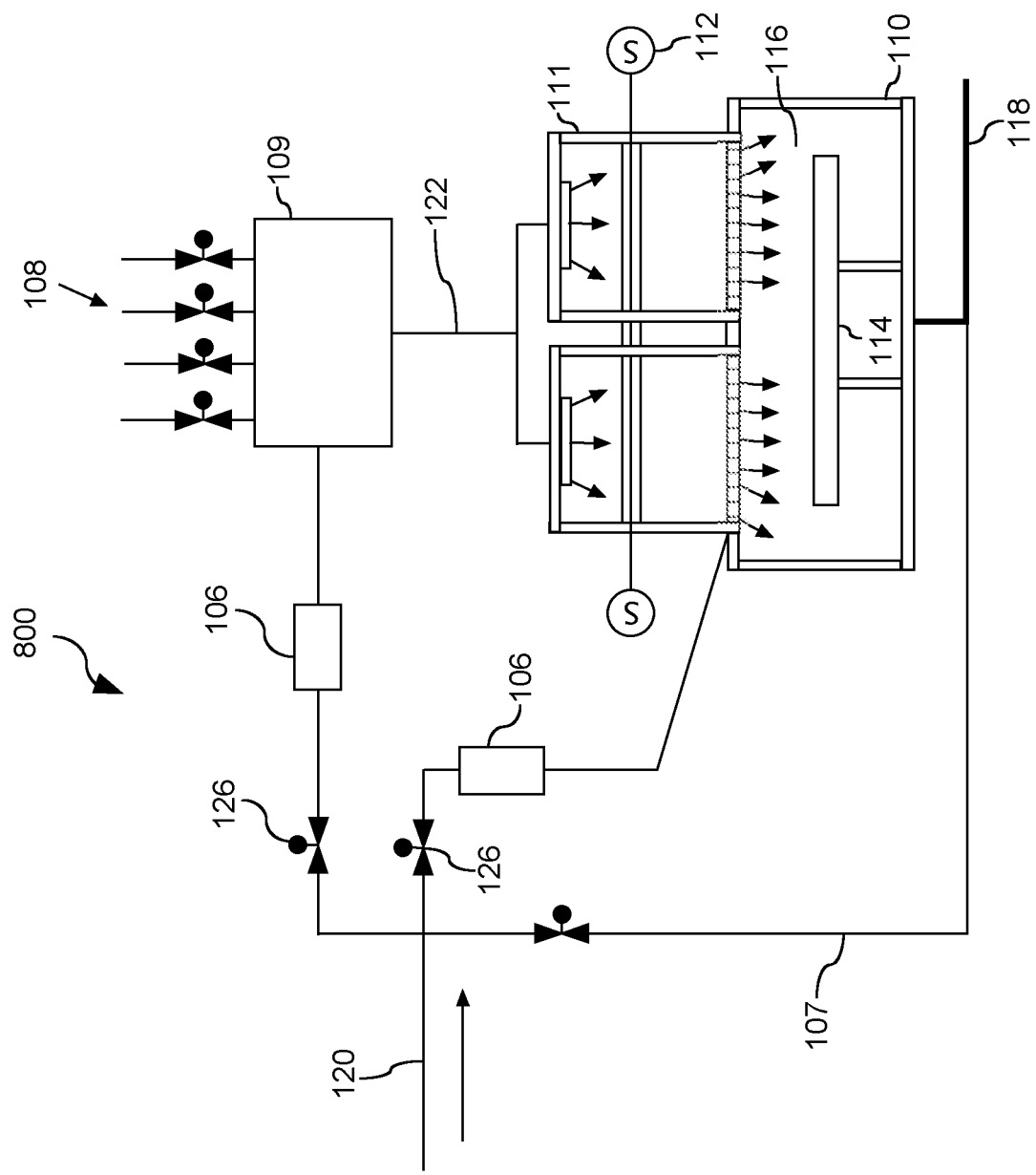
FIG. 9 depicts a semiconductor workpiece processing apparatus according to example embodiments of the present disclosure.

FIG. 9 illustrates an example processing apparatus 800 according to example embodiments of the present disclosure. In FIG. 9, the solvent line 120 has a controller and two control valves 126 that can route vaporized solvent (and potentially carrier gasses) directly into the process chamber 110, or upstream of the process chamber (e.g., into the gas box 109, as shown), or a combination of both. That is, the solvent line 120 can discharge into the process chamber 110 as well as into the gas box 109, gas box outlet 122, and the plasma chamber 111. The proportion of solvent (and optionally carrier gas) being sent to each of the process chamber 110, the gas box 109, the gas box outlet 122, and the plasma chamber 111 can therefore all be adjusted independently. That is, the solvent line 120 can have lines and flow control mechanisms (e.g., a controller, a control valve, and a mass/volume flow meter) to meter solvent as well as a carrier gas to any combination of the process chamber 110, the gas box 109, the gas box outlet 122, and the plasma chamber 111. The discharge configurations of FIGS. 7 and 8 can be adapted to any of the embodiments discussed herein.

Embodiments of the present disclosure include processing methods, specifically applicable to semiconductor workpieces, such as semiconductor wafers. The methods can include placing the workpiece into a process chamber 110, vaporizing a solvent and feeding the vaporized solvent into the process chamber 110, and exposing the workpiece to the vaporized solvent. Non-limiting examples of solvents that can be applied include isopropyl alcohol (IPA), acetone, methanol, N-methyl-2-pyrrolidone (NMP), N-ethyl-2-pyrrolidone (NEP), dimethyl sulfoxide (DMSO), propylene glycol methyl ether acetate (PGMEA), methyl ethyl ketone (MEK), n-Butyl acetate (NBA), γ-butyrolactone (GBL), propylene carbonate (PC), triethylamine (TEA), and acetonitrile. Furthermore, mixtures of solvents can also be applied and the solvents can be applied at various pressures and partial pressures.

Different solvents and mixtures of solvents can also be applied in series. For example, a workpiece can be exposed to a first solvent (or solvent mixture) for a first period followed by a second solvent for a second period. The workpiece can then be exposed to a third solvent (or solvent mixture) for a third period, and so on. Furthermore, the workpiece can be exposed to each solvent or solvent mixture with or without incorporating a plasma using an RF source 112.

The solvent can be carried to the process chamber 110 using one or more carrier gasses. The carrier gas can be an inert feed gas (e.g., noble gasses, etc.) or one or more of the carrier gasses can be active in the process chemistry by synergizing with the solvent or other process gasses emanating from the gas box 109. Specific examples of inter and/or carrier gases include helium, nitrogen, and/or argon.

The solvent can be put in gaseous form by feeding liquid solvent to a vaporizer 105. The amount of solvent fed to the process chamber 110 can be controlled using metering pumps 121, mass flow meters 106 (e.g., on the feed gas line 101 or solvent line 120), volumetric flow meters (e.g., on the feed gas line 101 or solvent line 120), logic controllers, control valves, and pressure gauges, as well as combinations thereof. Prior to feeding the solvent to the process chamber 120, the solvent flow rates can be stabilized or brought to steady state using a bypass line 107. After the solvent flow rate has stabilized, a control valve on the bypass line 107 can be closed and the solvent routed to the process chamber 110 where it can be exposed to the workpiece 116.

The solvent can be administered to the process chamber in various ways. That is, the solvent line 120 can direct the solvent to various locations within the processing apparatus such as the process chamber 110, the gas box 109, the gas box outlet 122, and the plasma chamber 111. Furthermore, the processing apparatus can incorporate all of these options into a single system and control the amount of solvent sent to each location using controllers, control valves, and mass and volumetric flow meters. Furthermore, an RF source 112 can be engaged to strike a plasma (with optionally incorporating various gasses from the various gas feed lines 108) before the solvent is administered, while the solvent is being administered, or after the solvent has been administered but is still residing within the process chamber 110. Engaging the RF source 112 allows for dissociating the vaporized solvent into active species that assist in the process.

The solvent can pass through a separation grid 113 prior to entering the process chamber 110. The separation grid 113 can disperse the vaporized solvent (and potentially other gasses) as it enters the process chamber 110 such that the gasses are evenly exposed to the workpiece 116. When the RF source 112 is engaged, the separation grid 113 can capture charged ions, allowing only neutral radicals to pass through to the process chamber 110 and keeping charged radicals out.

Methods can include exposing the workpiece 116 to a plasma-affected vaporized solvent (i.e., a vaporized solvent that has been exposed to a plasma and/or has been ignited by an RF source) and exposing the workpiece 116 to a non-plasma-affected vaporized solvent (i.e., a vaporized solvent that has not been exposed to a plasma and has not been ignited by an RF source). The method can also be reversed. That is, the workpiece 116 can be exposed to a non-plasma-affected vaporized solvent followed by a plasma-affected vaporized solvent. The vaporized solvent can also be mixed with one or more other gasses or plasmas (e.g., hydrogen-, nitrogen-, and/or oxygen-containing plasmas) and then be exposed to the workpiece 116.

The pressure in the process chamber 110 can be held constant or varied while the solvent is exposed to the workpiece 116. That is, the pressure in the process chamber 110 can be controlled to rise, fall, or fluctuate over time. Further, the partial pressures of the solvent and other gasses can be controlled.

The liquid solvent in the solvent storage receptacle 103 can be held at a constant temperature. The temperature of the liquid solvent is especially critical when the solvent vapor pressure is the primary or sole means of conveying solvent to the process chamber 110. Therefore, the solvent storage receptacle 103 can include a temperature control component for raising or lowering the temperature of the solvent. The temperature control component can include a coil 125 in which a heating or cooling fluid flows, or the coil 125 can include an electric heating element. The temperature control component can also take the form of a shell that encompasses the solvent storage receptacle 103 and contains and electric heating element or temperature control fluid. The solvent storage receptacle 103 may further have an insulating jacket to assist in controlling temperature.

The solvent storage receptacle 103 can take multiple forms including a metal or glass liquid tank, or a compressed gas tank. The solvent storage receptacle 103 can also be a metered ampoule that delivers a specific volume or mass of liquid solvent to the process chamber 110. An ampoule can be particularly useful in situations where the solvent is delivered downstream by heating and evaporating the liquid solvent within the solvent storage receptacle 103. The solvent can also be delivered downstream by dispersing (e.g., using a bubbler 115) a carrier gas within the liquid solvent or passing a carrier gas over the liquid solvent as it evaporates. The amount of solvent delivered can be controlled in this scenario, at least in part, by measuring and metering the flow rate (e.g., using a mass or volumetric flow meter and controller 106) of the carrier gas prior to the carrier gas making contact with the solvent.

As discussed above, the solvent can be delivered directly to the process chamber 110. Various other gases can also be delivered to the process chamber 110 in combination with the solvent. Furthermore, the solvent can be delivered directly to the process chamber 110 while various other gasses are delivered to the process chamber 110 in plasma form after passing through the plasma chamber 111. In addition and/or in the alternative, a fraction of the solvent can be diverted to the process chamber 110 while the remainder of the solvent passes through the plasma chamber 111 and is exposed to the RF source 112.

The process chamber 110 and/or workpiece can be heated while the solvent is being exposed to the workpiece 116. For example, the process chamber and/or workpiece can be maintained at a temperature range of from about 50° C. to about 400° C.

After the solvent has been exposed to the workpiece 116, the process chamber 110 can be evacuated using the process chamber evacuation pump 118. A purge gas can also be used to help empty the process chamber 110. However, the process pump 118 can also be used to maintain a constant pressure within the process chamber 110 as fresh solvent and potentially other gasses are introduced to the process chamber 110. The fresh solvent and other gasses can be introduced continuously (at a constant flow rate) or in periodic bursts (e.g., the process chamber is charged with fresh solvent every 10 minutes).

Instead of a single plasma chamber, the processing apparatus 100 can have multiple plasma chambers each having an RF source. For example, FIGS. 1, 4, 5, 6, 7, and 9 show a processing apparatus having dual plasma chambers 111 and dual RF sources 112. This can alloy for greater process efficiency as multiple workpieces can be treated in the process chamber 110 at once, helping to conserve the footprint of the process equipment and improving overall throughout.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    placing the workpiece into a process chamber;
    vaporizing a solvent to create a vaporized solvent;
    introducing a plasma-affected vaporized solvent into the process chamber;
    exposing the workpiece to the plasma-affected vaporized solvent such that the plasma-affected vaporized solvent removes material from the workpiece; and
    subsequent to exposing the workpiece to the plasma-affected vaporized solvent, exposing the workpiece to a non-plasma-affected vaporized solvent introduced into the process chamber;
    wherein the plasma-affected vaporized solvent comprising one or more of methanol, N-methyl-2-pyrrolidone (NMP), N-ethyl-pyrrolidone (NEP), dimethyl sulfoxide (DMSO), propylene glycol methyl ether acetate (PGMEA), methyl ethyl ketone (MEK), γ-butyrolactone (GBL), propylene carbonate (PC), triethylamine (TEA), and acetonitrile; and
    wherein the non-plasma-affected vaporized solvent comprises one or more of methanol, N-methyl-2-pyrrolidone (NMP), N-ethyl-pyrrolidone (NEP), dimethyl sulfoxide (DMSO), propylene glycol methyl ether acetate (PGMEA), methyl ethyl ketone (MEK), γ-butyrolactone (GBL), propylene carbonate (PC), triethylamine (TEA), and acetonitrile.

2. The method of claim 1, wherein the plasma-affected vaporized solvent and the non-plasma-affected vaporized solvent are each introduced into the process chamber with a feed gas.

3. The method of claim 1, wherein the plasma-affected vaporized solvent is introduced into the process chamber via a plasma chamber, the plasma chamber being separated from the process chamber by a separation grid.

4. The method of claim 3, wherein the plasma chamber includes a radio frequency (RF) plasma source operable to generate a plasma prior to introducing the plasma-affected vaporized solvent into the process chamber.

5. The method of claim 1, wherein the plasma-affected vaporized solvent and the non-plasma-affected vaporized solvent are each vaporized by bubbling a gas through a liquid solvent or passing a gas over a liquid solvent.

6. The method of claim 1, wherein a plasma is generated in a plasma chamber, and the non-plasma-effected vaporized solvent is introduced directly into the process chamber at a location downstream of the plasma chamber.

7. The method of claim 1, wherein the method is used for removing a photoresist or for removing post-etch residue.

8. The method of claim 1, wherein the workpiece includes a silicon (Si), germanium (Ge), and/or SiGe material.

\* \* \* \* \*